(12) United States Patent
Chen et al.

(10) Patent No.: US 9,087,810 B2
(45) Date of Patent: Jul. 21, 2015

(54) THIN FILM TRANSISTOR STRUCTURE AND DISPLAY DEVICE HAVING SAME

(75) Inventors: Chao-Jung Chen, Hsinchu (TW); I-Hsuan Chiang, Hsinchu (TW)

(73) Assignee: E INK HOLDINGS INC., Hsinchu (TW)

( * ) Notice: Subject to any disclaimer, the term of this patent is extended or adjusted under 35 U.S.C. 154(b) by 395 days.

(21) Appl. No.: 13/396,784

(22) Filed: Feb. 15, 2012

(65) Prior Publication Data

US 2012/0235235 A1   Sep. 20, 2012

(30) Foreign Application Priority Data

Mar. 17, 2011   (TW) .............................. 100109211 A

(51) Int. Cl.

| | |
|---|---|
| *H01L 29/04* | (2006.01) |
| *H01L 29/10* | (2006.01) |
| *H01L 31/00* | (2006.01) |
| *H01L 29/417* | (2006.01) |
| *H01L 27/12* | (2006.01) |
| *H01L 29/786* | (2006.01) |
| *H01L 27/32* | (2006.01) |

(52) U.S. Cl.
CPC ...... *H01L 29/41733* (2013.01); *H01L 27/1222* (2013.01); *H01L 29/78696* (2013.01); *H01L 27/3262* (2013.01)

(58) Field of Classification Search
CPC ............ H01L 27/1233; H01L 27/1251; H01L 27/1288; H01L 29/04; H01L 29/786; H01L 29/78648; H01L 29/78696
USPC ...................... 257/59, 66, 347, 350
See application file for complete search history.

(56) References Cited

U.S. PATENT DOCUMENTS

| | | | | |
|---|---|---|---|---|
| 6,046,479 A | * | 4/2000 | Young et al. ................... | 257/350 |
| 6,281,552 B1 | * | 8/2001 | Kawasaki et al. ............. | 257/350 |
| 7,098,087 B2 | * | 8/2006 | Akimoto et al. .............. | 438/151 |

(Continued)

FOREIGN PATENT DOCUMENTS

| | | |
|---|---|---|
| CN | 101626036 A | 1/2010 |
| TW | 201104874 A1 | 2/2011 |

(Continued)

OTHER PUBLICATIONS

China Patent Office, "Office Action", Apr. 2, 2014.

(Continued)

*Primary Examiner* — Zandra Smith
*Assistant Examiner* — John M Parker
(74) *Attorney, Agent, or Firm* — WPAT, PC; Justin King

(57) ABSTRACT

A thin film transistor structure includes a substrate, a gate layer, a gate insulator layer, a first semiconductor island, a second semiconductor island and a source and drain layer. The gate layer is disposed on the substrate, and includes a first gate electrode and a second electrode electrically connected to the first gate electrode. The gate insulator layer is disposed on the substrate and covers the first and second gate electrodes. The first semiconductor island is disposed on the gate insulator layer and corresponding to the first gate electrode. The second semiconductor island is disposed on the gate insulator layer and corresponding to the second electrode. The source and drain layer is disposed on the gate insulator layer and next to the first semiconductor island and the second semiconductor island. A display device using the above thin film transistor structure is also provided.

23 Claims, 6 Drawing Sheets

(56) References Cited

U.S. PATENT DOCUMENTS

| | | | |
|---|---|---|---|
| 7,163,850 B2 * | 1/2007 | Oda et al. | 438/154 |
| 8,395,156 B2 * | 3/2013 | Miyairi et al. | 257/59 |
| 2001/0045558 A1 * | 11/2001 | Kawasaki et al. | 257/66 |
| 2010/0025677 A1 | 2/2010 | Yamazaki et al. | |
| 2011/0121300 A1 * | 5/2011 | Miyairi et al. | 257/59 |

FOREIGN PATENT DOCUMENTS

| | | |
|---|---|---|
| TW | 201108417 A | 3/2011 |
| TW | 201110346 A | 3/2011 |

OTHER PUBLICATIONS

Taiwan Patent Office, "Office Action", Apr. 18, 2014.

* cited by examiner

THIN FILM TRANSISTOR STRUCTURE AND DISPLAY DEVICE HAVING SAME

FIELD OF THE INVENTION

The present invention generally relates to a display device, and more particularly relates to a display device and a thin film transistor structure of the same.

BACKGROUND OF THE INVENTION

Thin film transistors have been widely used in display applications such as liquid crystal displays (LCD), electronic paper displays (EPD), and organic light emitting diode displays (OLED).

Generally, a thin film transistor structure includes a substrate, a gate electrode, a gate insulator layer, a channel island, a source electrode, and a drain electrode. The gate electrode is disposed on the substrate, the gate insulator layer covers the gate electrode, the channel island is disposed on the gate insulator layer and the source electrode and the drain electrode are disposed on the channel island.

The above-described type of thin film transistor can be well used in a LCD. However, if the thin film transistor structure is used in an EPD, the channel island might become conductive after being irradiated by external light, resulting in current leakage occurring in the island structure. As a result of the current leakage, the EPD suffers from abnormal displaying (e.g. image or color distortion).

Therefore, how to avoid abnormal displaying and improve displaying quality of EPDs become the area that researchers and developers are focused on.

SUMMARY OF THE INVENTION

In accordance with the present invention, a thin film transistor (TFT) having a dual channel island structure is provided for minimizing the irradiation effect of external light.

A display device including the desirable TFT structure is also provided.

In one embodiment, a thin film transistor structure includes a substrate, a gate layer, a gate insulator layer, a first semiconductor island, a second semiconductor island and a source and drain layer. The gate layer is disposed on the substrate, and has a first gate electrode and a second electrode electrically connected with the first gate electrode. The gate insulator layer is disposed on the substrate and covers the first and second gate electrodes. The first semiconductor island is disposed on the gate insulator layer and corresponding to the first gate electrode. The second semiconductor island is disposed on the gate insulator layer and corresponding to the second electrode. The source and drain layer is disposed on the gate insulator layer and next to the first semiconductor island and the second semiconductor island.

In another embodiment, a display device includes a TFT substrate having a number of thin film transistors and a display layer disposed on the TFT substrate. Each of the thin film transistors includes a substrate, a first gate electrode, a second gate electrode, a gate insulator layer, a first semiconductor island, a second semiconductor island, a source electrode, and a drain electrode. The first gate electrode is disposed on the substrate; the second gate electrode is also disposed on the substrate and electrically connected to the first gate electrode. The gate insulator layer is disposed on the substrate and covers the first and second gate electrodes. The first semiconductor island is disposed on the gate insulator layer and corresponding to the first gate electrode. The second semiconductor island is disposed on the gate insulator layer and corresponding to the second electrode. The source electrode is disposed on the gate insulator layer next to one of the first semiconductor island and the second semiconductor island. The drain electrode is disposed on the gate insulator layer next to the other of the first and second semiconductor islands.

In still another embodiment, a display device includes a TFT substrate and a display layer disposed on the TFT substrate. The TFT substrate has a first TFT structure and a second TFT structure adjacent to the first TFT structure. The first TFT structure includes a first semiconductor island disposed above a first gate electrode, the second TFT structure includes a second semiconductor island disposed above a second gate electrode, and the first semiconductor island has a different structure from the second semiconductor island.

Since the above-described TFT structures as well as the display device including any of the TFT structures include semiconductor double islands, the objectives of minimizing irradiation effect and reducing leakage current can be achieved. As a result, the abnormal displaying of the display device can be avoided and it is helpful to improve the displaying effect of the display device.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
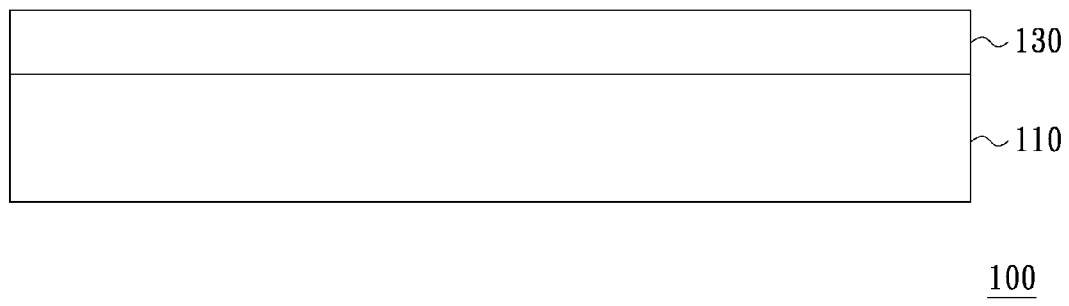
FIG. 1 is a schematic cross-sectional view showing relative layers included in a display device.
Figure 2:
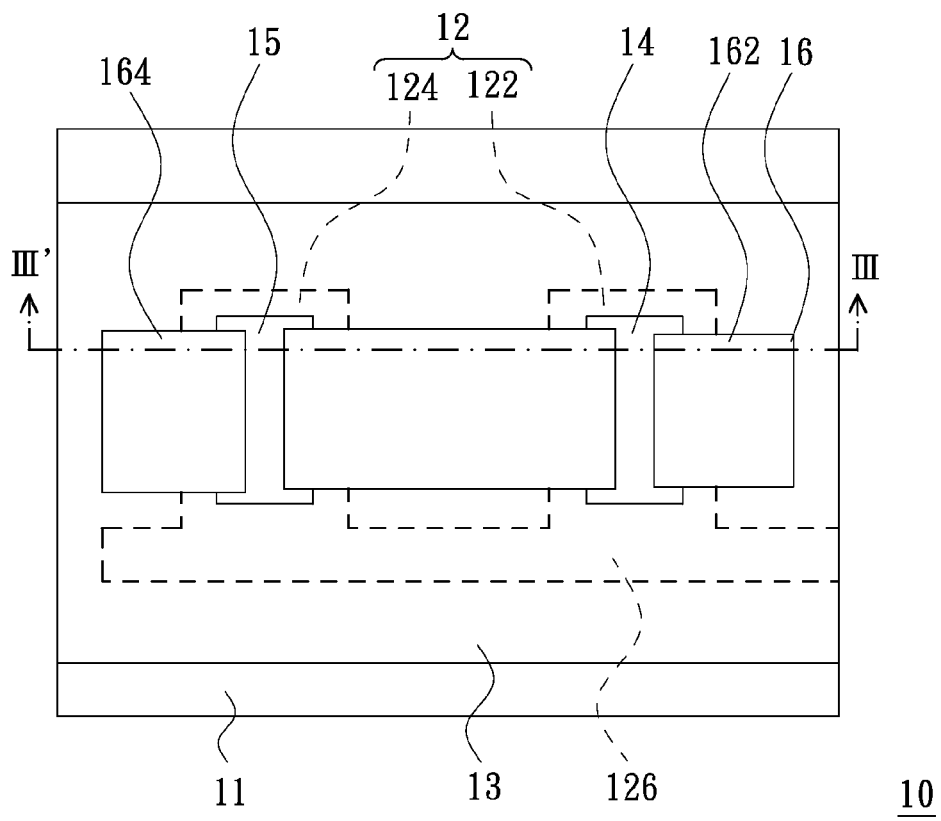
FIG. 2 is a schematic top view of a first embodiment of a thin film transistor structure according to the present invention, applicable to the thin film transistor substrate shown in FIG. 1.
Figure 3:
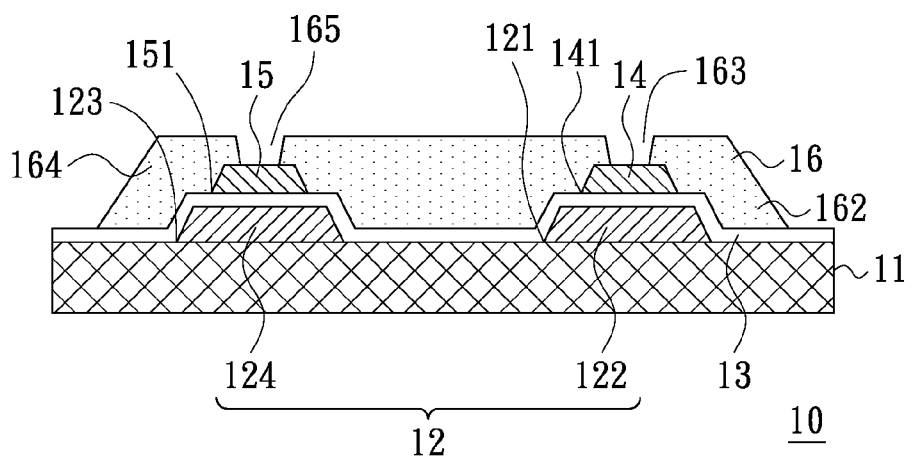
FIG. 3 is a schematic cross-sectional view taken along a line III-III' of the thin film transistor structure shown in FIG. 2.

FIG. 1 schematically illustrates relative layers of a display device. FIG. 2 is a schematic top view illustrating a first embodiment of a thin film transistor structure of the display device shown in FIG. 1. FIG. 3 is a schematic cross-sectional view taken along a line III-III' of the thin film transistor structure shown in FIG. 2. Referring to FIG. 1, a display device 100 includes a thin film transistor (TFT) substrate 110 and a display layer 130. The display layer 130 is disposed on the TFT substrate 110.

The display device 100 is, for example, but not limited to, an electronic paper display device. In this embodiment, the display layer 130 can be an electrophoretic display layer.

Referring to FIGS. 2 and 3, the TFT substrate 110 includes a plurality of TFT structures 10. Each of the TFT structures 10 includes a substrate 11, a gate layer 12, a gate insulator layer 13, a first semiconductor island 14 serving as a first channel island, a second semiconductor island 15 serving as a second channel island and a source and drain layer 16. It is to be noted that the term "source and drain layer" used herein indicates that a source electrode and a drain electrode are included in this layer to form a part of the TFT. The relative positions of the source electrode and the drain electrode are variable and the manufacturing processes of the source electrode and the drain electrode can be integrated or independent, depending on practical requirements. The gate layer 12 is disposed on the substrate 11, and includes a first gate electrode 122 and a second gate electrode 124 electrically connected to each other. The gate insulator layer 13 is disposed on the substrate 11 and covers the gate layer 12. The first semiconductor island 14 is disposed on the gate insulator layer 13 above the first gate electrode 122, and covers a portion of the gate insulator layer 13 that is on the first gate electrode 122. The second semiconductor island 15 is disposed on the gate insulator layer 13 above the second gate electrode 124, and covers a portion of the gate insulator layer 13 that is on the second gate electrode 124. The source and drain layer 16 overlies the resulting substrate with recesses 163 and 165 for partially exposing the first semiconductor island 14 and the second semiconductor island 15. The source and drain layer 16 includes a source electrode 162 and a drain electrode 164. For example, the source electrode 162 is disposed next to the first semiconductor island, and the drain electrode 164 is disposed next to the second semiconductor island 15. However, configuration of the source/drain layer is not limited as described above.

In this embodiment, the first gate electrode 122 and the second gate electrode 124 are electrically connected to each other via a gate line 126. In particular, the gate line 126, the first gate electrode 122, and the second gate electrode 124 can be simultaneously formed to simplify the manufacturing process.

As shown in FIG. 3, both the first semiconductor island 14 and the second semiconductor island 15 have an "island in" structure. That is, the entire circumference 141 of the first semiconductor island 14 in a top view is inward offset from the circumference 121 of the first gate electrode 122. Likewise, the entire circumference 151 of the second semiconductor island 15 in a top view is inward offset at a certain distance from the circumference 123 of the second gate electrode 124.

Figure 4:
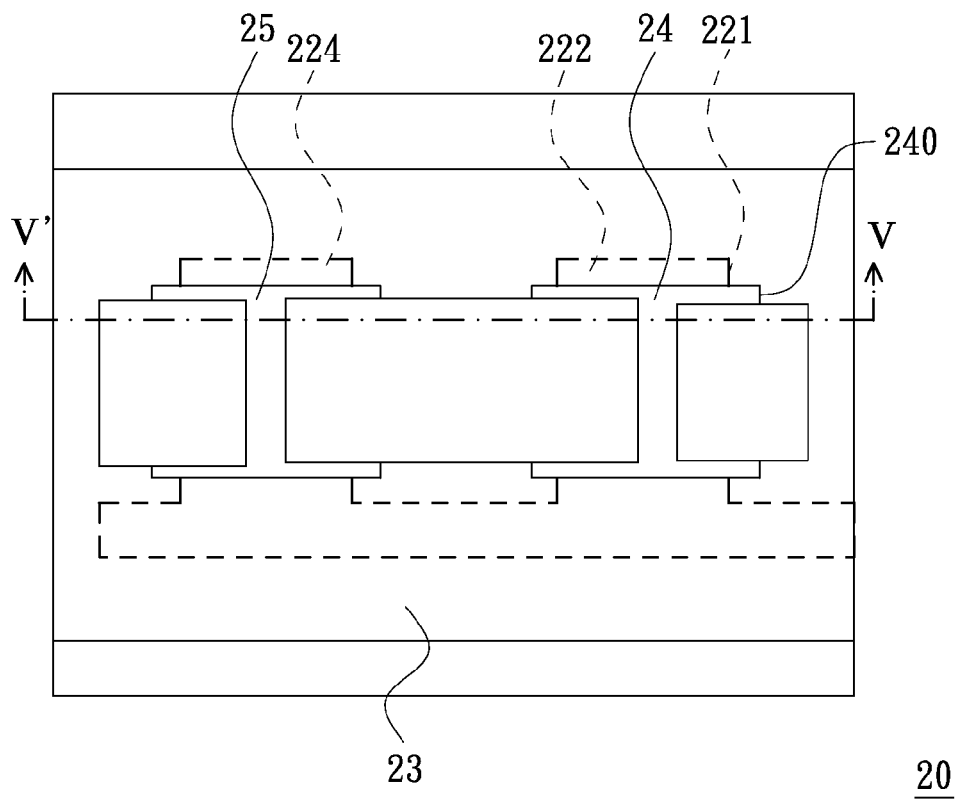
FIG. 4 is a schematic top view of a second embodiment of a TFT structure according to the present invention, applicable to the thin film transistor substrate shown in FIG. 1.
Figure 5:
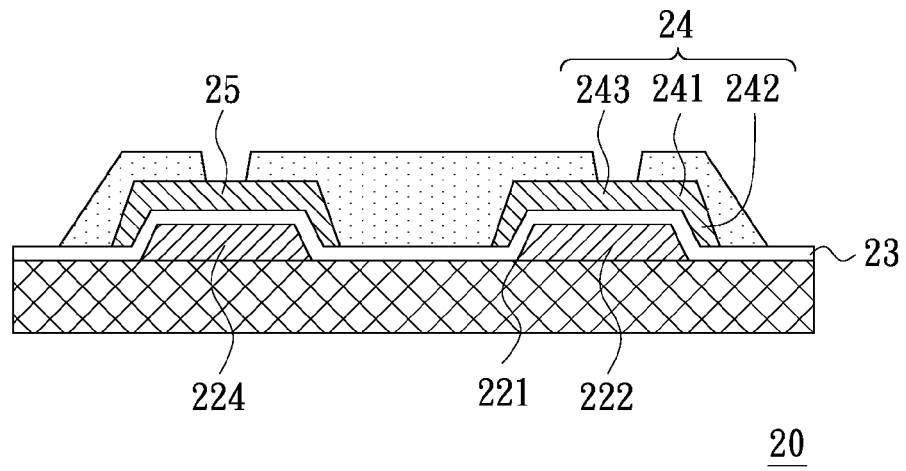
FIG. 5 is a schematic cross-sectional view taken along a line V-V' of the TFT structure shown in FIG. 4.

Please refer to FIG. 4 and FIG. 5, in which a second embodiment of a TFT structure is schematically illustrated, and FIG. 5 is a schematic cross-sectional view taken along a line V-V' of FIG. 4. In this embodiment, a TFT structure 20 includes a first semiconductor island 24 and a second semiconductor island 25, both of which have an "island out" structure. That is, opposite lateral sides 240 of the first semiconductor island 24 are outward offset from corresponding lateral sides 221 of the first gate electrode 222. The first semiconductor island 24 includes a central portion 243, a circumferential portion 242 and a bending portion 241 disposed between the central portion 243 and the circumferential portion 242, and having a turning corner. With the bending portion 241, the circumferential portion 242 deflects from the central portion 243 and extends downwards to surround the first gate electrode 222. For minimizing the area of the island, the bending portion 241 may be arranged substantially right above the lateral side 221 of the first gate electrode 222. On the other hand, the circumferential portion 242 of the first semiconductor island 24 desirably extends down to the gate insulator layer 23 overlying on the substrate. Similar arrangement can be made to the second semiconductor island 25, and thus it is not redundantly described herein.

Figure 6:
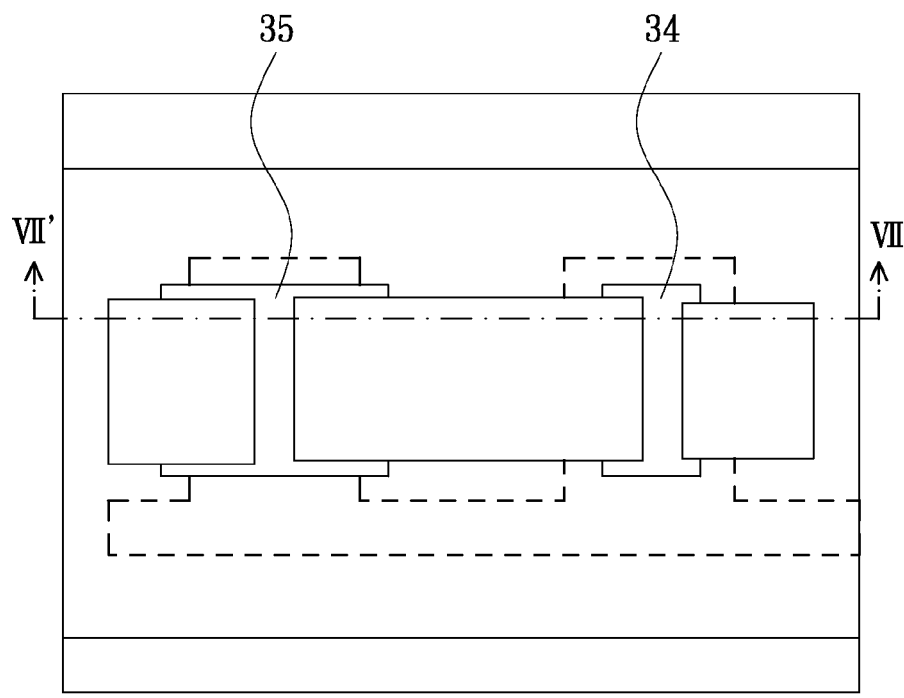
FIG. 6 is a schematic top view of a third embodiment of a TFT structure according to the present invention, applicable to the thin film transistor substrate shown in FIG. 1.
Figure 7:
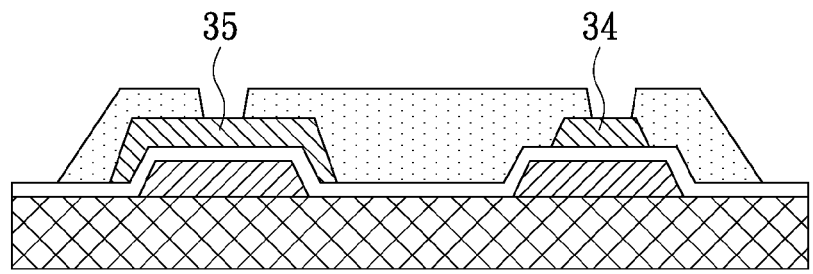
FIG. 7 is a schematic cross-sectional view taken along a line VII-VII' of the TFT structure shown in FIG. 6.

FIG. 6 is a schematic top view of a TFT structure in accordance with a third embodiment of the present invention, and FIG. 7 is a schematic cross-sectional view taken along a line VII-VII' of FIG. 6. Referring to FIGS. 6 and 7, a TFT structure 30 includes a first semiconductor island 34 having an "island in" structure and a second semiconductor island 35 having an "island out" structure, as described above.

Figure 8:
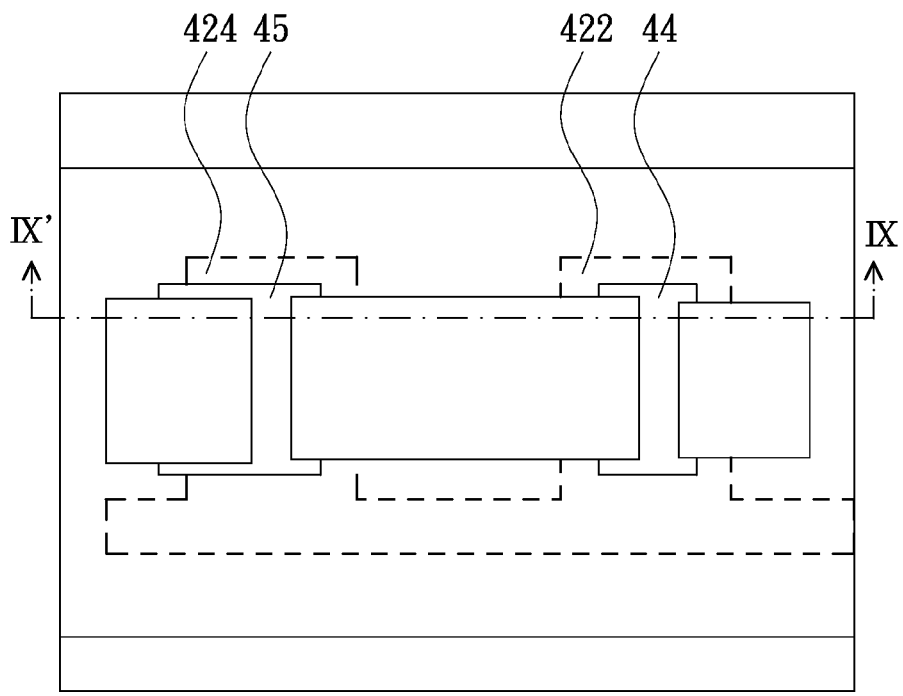
FIG. 8 is a schematic top view of a fourth embodiment of a TFT structure according to the present invention, applicable to the thin film transistor substrate shown in FIG. 1.
Figure 9:
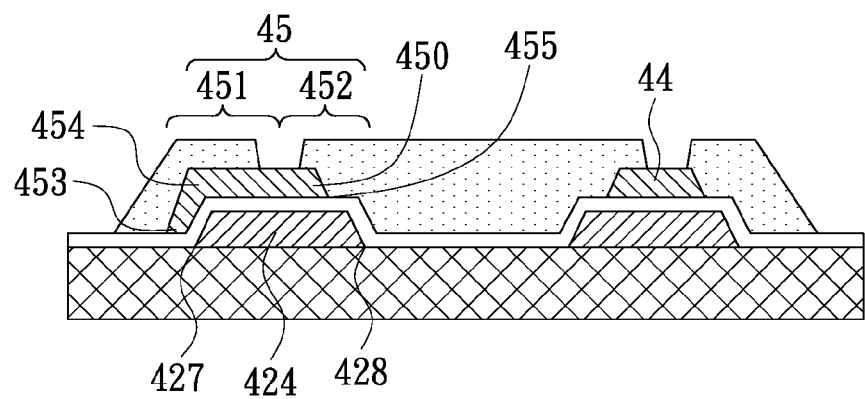
FIG. 9 is a schematic cross-sectional view taken along a line IX-IX' of the TFT structure shown in FIG. 8.

FIG. 8 is a schematic top view of a TFT structure in accordance with a fourth embodiment of the present invention, and FIG. 9 is a schematic cross-sectional view taken along a line IX-IX' of FIG. 8. Referring to FIGS. 8 and 9, in a TFT structure 40 includes a first semiconductor island 44 having an "island in" structure as described above, and a second semiconductor island 45 having a partially in and partially out structure. That is, a first part 451 of the second semiconductor island 45 at a lateral side is "island out", and a second part 452 of the second semiconductor island 45 at an opposite lateral side is "island in". For example, the first part 451 of the second semiconductor island 45 has a circumferential portion 453 deflecting from a central portion 450 and extending downwards from a bending portion 454. The bending portion 454 is arranged right above the first edge 427 of the gate electrode 424. On the other hand, a circumference 455 of the second part 452 of the second semiconductor island 45 is inward offset at a certain distance from a second edge 428 of the gate electrode 424. The second edge 428 is opposite to the first edge 427. It is to be noted that the above-described configurations are just give for examples, and variations can be made depending on practical requirements. For example, it is feasible that the semiconductor island 34 is "island out" while the semiconductor island 35 is "island in"; or the first semiconductor island 44 is "partially island out and partially island in" while the second semiconductor island 45 is "island in". Alternatively, both the first and second semiconductor islands 44 and 45 can be "partially island out and partially island in".

Any of the above embodiments of TFT transistor structures 10, 20, 30, 40, each having a dual island structure, is applicable to the TFT substrate 110 of the display device 100. The dual island structures are advantageous in preventing abnormal displaying and improve displaying effect of the display device 100. The alternate "island in" and "island out" structures further minimize common voltage coupling.

Figure 10:
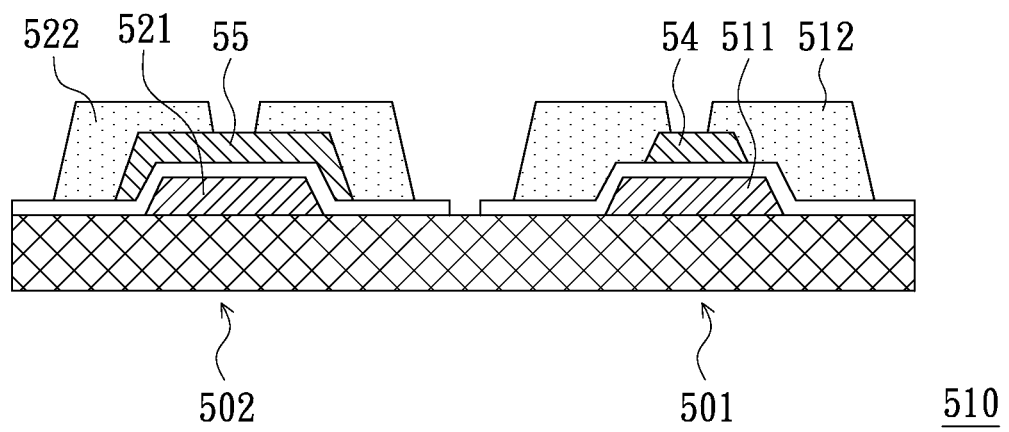
FIG. 10 is a schematic cross-sectional view of a fifth embodiment of a TFT structure according to the present invention, applicable to the thin film transistor substrate shown in FIG. 1.

Instead of a single TFT with two different channel island structures corresponding two gate electrodes, the TFT structure used in a display device according to the present invention may alternatively include TFTs having different channel island structures. For example, referring to FIG. 10, a TFT structure 510 includes a first TFT unit 501 and a second TFT unit 502 adjacent to the first TFT structure 501. The first TFT unit 501 includes a first semiconductor island 54 serving as a channel island above a gate electrode 511 between source/drain electrodes 512, and a second TFT unit 502 includes a second semiconductor island 55 serving as a channel island above a gate electrode 521 between source/drain electrodes 522. The displaying effect can be improved by differentiating the first semiconductor island 54 from the second semiconductor island 55. For example, the first semiconductor island 54 has an "island in" structure and the second semiconductor island 55 has an "island out" structure, as described above.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A thin film transistor structure, comprising:
    a substrate;
    a gate layer disposed on the substrate and including a first gate electrode and a second gate electrode electrically connected to the first gate electrode, wherein the first gate electrode and the second gate electrode are parts of the same thin film transistor structure;
    a gate insulator layer, disposed on the substrate and covering the first and second gate electrodes;
    a first semiconductor island disposed on the gate insulator layer and corresponding to the first gate electrode;
    a second semiconductor island disposed on the gate insulator layer and corresponding to the second gate electrode; and
    a source and drain layer disposed on the gate insulator layer and next to the first and second semiconductor islands, wherein the source and drain layer partially covers a top surface of the first semiconductor island and a top surface of the second semiconductor island.

2. The thin film transistor structure of claim 1, wherein the source and drain layer includes a source electrode disposed next to one of the first and second semiconductor islands and a drain electrode disposed next to the other of the first and second semiconductor islands, and the first semiconductor island has the same structure as the second semiconductor island.

3. The thin film transistor structure of claim 2, wherein the source and drain layer further comprises an intermediate electrode disposed between the drain electrode and the source electrode, and the intermediate electrode covers an interval between the first gate electrode and the second gate electrode.

4. The thin film transistor structure of claim 1, wherein the source and drain layer includes a source electrode disposed next to one of the first and second semiconductor islands and a drain electrode disposed next to the other of the first and second semiconductor islands, and the first semiconductor island has a different structure from the second semiconductor island.

5. The thin film transistor structure of claim 4, wherein the source and drain layer further comprises an intermediate electrode disposed between the drain electrode and the source electrode, and the intermediate electrode covers an interval between the first gate electrode and the second gate electrode.

6. The thin film transistor structure of claim 1, wherein the source and drain layer includes a source electrode disposed next to a side of one of the first and second semiconductor islands and a drain electrode disposed next to an opposite side of the one of the first and second semiconductor islands, and includes another source electrode disposed next to a side of the other of the first and second semiconductor islands and a drain electrode disposed next to an opposite side of the other of the first and second semiconductor islands, and the first semiconductor island and the second semiconductor island have different structures.

7. The thin film transistor structure of claim 1, wherein the second semiconductor island includes a central portion, a circumferential portion and a bending portion disposed between the central portion and the circumferential portion, and having a turning corner.

8. The thin film transistor structure of claim 7, wherein the circumferential portion of the second semiconductor island extends down to the gate insulator layer overlying on the substrate.

9. The thin film transistor structure of claim 1, wherein the second semiconductor island includes a bending portion disposed right above a side of the first gate electrode and having a turning corner.

10. The thin film transistor structure of claim 9, wherein the second semiconductor island includes a circumferential portion extending from the bending portion down to the gate insulator layer overlying on the substrate.

11. The thin film transistor structure of claim 1, wherein an orthogonal projection of the second semiconductor island projected on the substrate has a first side and a second side opposite to the first side, the first side of the orthogonal projection of the second semiconductor island is located out of an orthogonal projection of the second gate electrode projected on the substrate, the second side of the orthogonal projection of the second semiconductor island is located within the orthogonal projection of the second gate electrode projected on the substrate.

12. The thin film transistor structure of claim 1, wherein an orthogonal projection of the first semiconductor island projected on the substrate has a third side and a fourth side opposite to the third side, the third side of the orthogonal projection of the first semiconductor island is located out of an orthogonal projection of the first gate electrode projected on the substrate, and the fourth side of the orthogonal projection of the first semiconductor island is located within the orthogonal projection of the first gate electrode projected on the substrate.

13. The thin film transistor structure of claim 1, wherein an orthogonal projection of the first semiconductor island projected on the substrate is entirely located within an orthogonal projection of the first gate electrode projected on the substrate, and an orthogonal projection the second semiconductor island projected on the substrate has two opposite sides located out of an orthogonal projection of the second gate electrode projected on the substrate.

14. The thin film transistor structure of claim 1, wherein an orthogonal projection of the first semiconductor island projected on the substrate is entirely located within an orthogonal projection of the first gate electrode projected on the substrate, an orthogonal projection of the second semiconductor island projected on the substrate has a first side and a second side opposite to the first side, the first side is located out of an orthogonal projection of the second gate electrode projected on the substrate, and the second side is located within the orthogonal projection of the second gate electrode projected on the substrate.

15. The thin film transistor structure of claim 1, wherein the first gate electrode and the second gate electrode are directly connected to a same gate line.

16. A display device, comprising:
a thin film transistor substrate having a plurality of thin film transistors, each of the thin film transistors comprising:
a substrate;
a gate layer disposed on the substrate and including a first gate electrode and a second gate electrode electrically connected to the first gate electrode, wherein the first gate electrode and the second gate electrode are parts of the same thin film transistor;
a gate insulator layer disposed on the substrate and covering the first and second gate electrodes;
a first semiconductor island disposed on the gate insulator layer and corresponding to the first gate electrode;
a second semiconductor island disposed on the gate insulator layer and corresponding to the second gate electrode;
a source electrode disposed on the gate insulator layer next to one of the first and second semiconductor islands; and
a drain electrode disposed on the gate insulator layer next to the other of the first and second semiconductor islands; and
a display layer disposed over the thin film transistor substrate, wherein the source electrode partially covers a top surface of one of the first semiconductor island and the second semiconductor island, and the drain electrode partially covers a to surface of the other one of the first semiconductor island and the second semiconductor island.

17. The display device of claim 16, wherein the first semiconductor island and the second semiconductor island have the same structure.

18. The display device of claim 16, wherein the first semiconductor island and the second semiconductor island have different structures.

19. The display device of claim 16, wherein the display layer is an electrophoretic display layer.

20. The display device of claim 16, wherein an orthogonal projection of the first semiconductor island projected on the substrate is entirely located within an orthogonal projection of the first gate electrode projected on the substrate, and an orthogonal projection the second semiconductor island projected on the substrate has two opposite sides located out of an orthogonal projection of the second gate electrode projected on the substrate.

21. The display device of claim 16, wherein an orthogonal projection of the first semiconductor island projected on the substrate is entirely located within an orthogonal projection of the first gate electrode projected on the substrate, an orthogonal projection of the second semiconductor island projected on the substrate has a first side and a second side opposite to the first side, the first side is located out of an orthogonal projection of the second gate electrode projected on the substrate, and the second side is located within the orthogonal projection of the second gate electrode projected on the substrate.

22. The display device of claim 16, wherein the first gate electrode and the second gate electrode are directly connected to a same gate line.

23. The display device of claim 16, wherein the thin film transistor further comprises an intermediate electrode disposed between the drain electrode and the source electrode, the intermediate electrode covers an interval between the first gate electrode and the second gate electrode, and the intermediate electrode, the drain electrode and the source electrode belong to a source and drain layer of the thin film transistor.

* * * * *